(12) United States Patent
Ishii

(10) Patent No.: US 9,437,283 B2
(45) Date of Patent: Sep. 6, 2016

(54) SEMICONDUCTOR STORAGE DEVICE

(71) Applicant: RENESAS ELECTRONICS CORPORATION, Tokyo (JP)

(72) Inventor: Yuichiro Ishii, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/847,365

(22) Filed: Sep. 8, 2015

(65) Prior Publication Data

US 2016/0071576 A1   Mar. 10, 2016

(30) Foreign Application Priority Data

Sep. 9, 2014   (JP) .................................. 2014-183300

(51) Int. Cl.
*G11C 5/14* (2006.01)
*G11C 11/419* (2006.01)
*G11C 11/412* (2006.01)
*G11C 7/20* (2006.01)

(52) U.S. Cl.
CPC ............. *G11C 11/419* (2013.01); *G11C 5/147* (2013.01); *G11C 7/20* (2013.01); *G11C 11/412* (2013.01)

(58) Field of Classification Search
CPC ... G11C 11/419; G11C 11/412; G11C 5/147; G11C 7/20; G11C 11/4072; G11C 11/4076
USPC .......... 365/154, 156, 226, 227, 229, 189.89, 365/189.11, 185.24
See application file for complete search history.

(56) References Cited

U.S. PATENT DOCUMENTS

| 7,826,298 B2 | 11/2010 | Nakai et al. |
| 8,391,078 B2 * | 3/2013 | Leung ................... G11C 11/404 365/185.05 |
| 8,891,285 B2 * | 11/2014 | Takemura ............. G11C 11/403 365/149 |

FOREIGN PATENT DOCUMENTS

JP   2008-293594 A   12/2008

* cited by examiner

*Primary Examiner* — Gene Auduong
(74) *Attorney, Agent, or Firm* — McDermott Will & Emery LLP

(57) ABSTRACT

The disclosed invention provides a semiconductor storage device that creates no trouble, independently of power-on sequence. A semiconductor storage device includes a first power supply for the memory cells, a second power supply which is turned on independently of the first power supply and provided for a peripheral circuit which is electrically coupled to the memory cells, and a word line level fixing circuit for fixing the level of the word lines, which operates in accordance with turn-on of the first power supply. The word line level fixing circuit includes multiple level fixing transistors which are provided to correspond respectively to the word lines and provided between one of the word lines and a fixed potential and a level fixing control circuit which controls the level fixing transistors in accordance with input of a signal responding to turn-on of the second power supply.

8 Claims, 3 Drawing Sheets

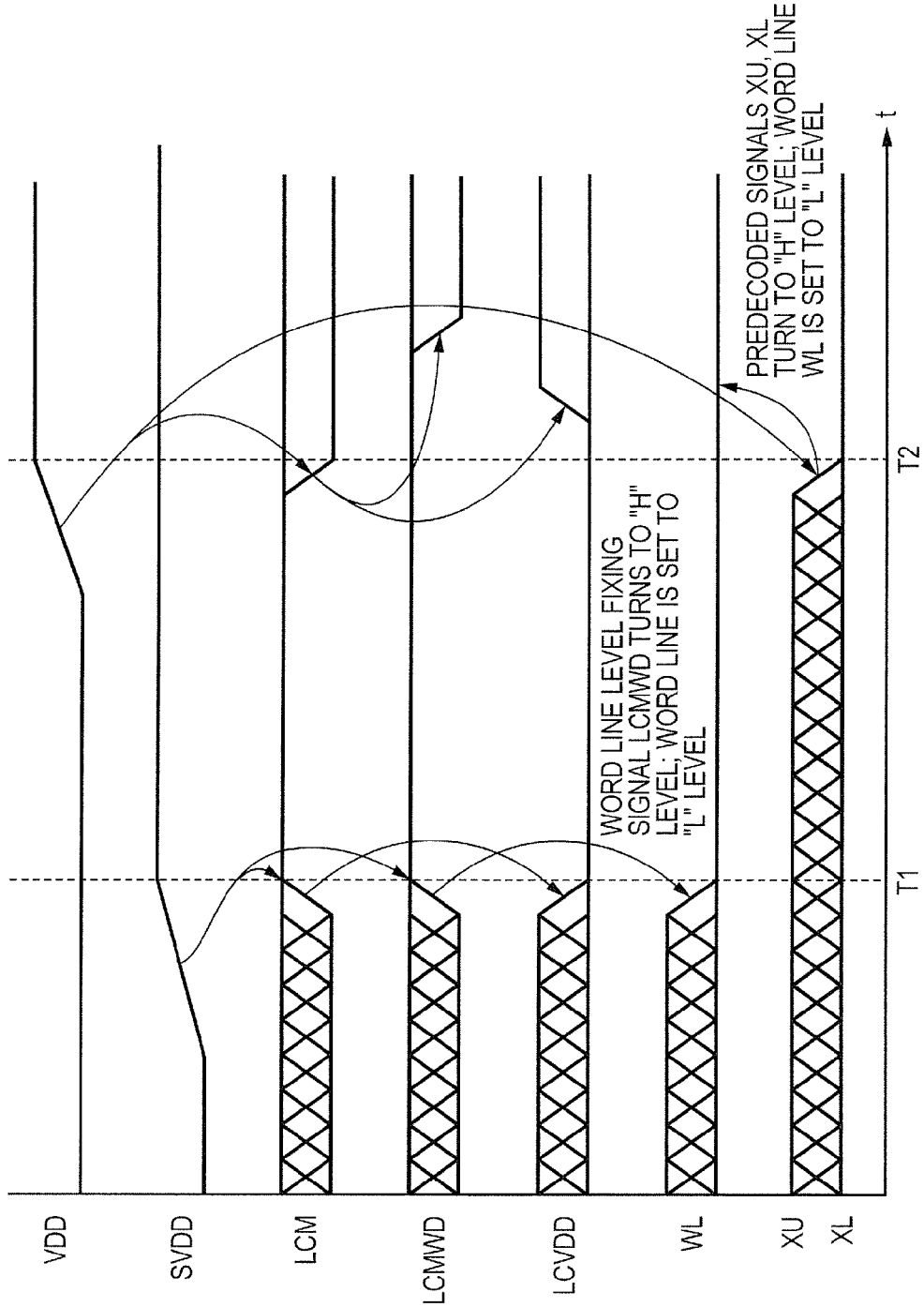

SEMICONDUCTOR STORAGE DEVICE

CROSS-REFERENCE TO RELATED APPLICATIONS

The disclosure of Japanese Patent Application No. 2014-183300 filed on Sep. 9, 2014 including the specification, drawings and abstract is incorporated herein by reference in its entirety.

BACKGROUND

The present invention relates to a semiconductor storage device and, particularly, to a semiconductor storage device in which power supplies of a memory array and a peripheral circuit are separated.

Reducing a standby current for a SRAM (Static Random Access Memory) has so far been pursued. In a certain SRAM, a separate supply voltages are supplied to memory cells in a memory array and to a peripheral circuit and it is contrived to reduce a standby current by shutting off the supply of the supply voltage to the peripheral circuit during standby (Patent Document 1).

Also, a scheme is used that reduces operating power, while maintaining data retention properties by decreasing the supply voltage to a peripheral circuit, while keeping the supply voltage to the memory array high during operation.

In a case where a memory has two power supplies: a power supply for memory cells in a memory array and a supply voltage for a peripheral circuit, a rule of power-on sequence is generally established.

For example, a rule of power-on sequence specifies that the supply voltage for a peripheral circuit must be turned on first before turning on the power supply for memory cells in a memory array.

If such rule is not observed, there is a possibility of trouble occurring, such as a through-current flowing from one power supply to another power supply according to turn-on order, malfunction, and failure.

Therefore, such a power-on sequence is often prescribed in SRAM specifications.

RELATED ART DOCUMENT

Patent Document

[Patent Document 1]
Japanese Published Unexamined Patent Application No. 2008-293594

SUMMARY

However, such a rule of power-on sequence imposes unwanted burdens on circuit designers and urges them to make improvement.

The invention disclosed herein has been developed to solve the above problem and aims to provide a semiconductor storage device that creates no trouble, independently of power-on sequence.

Other problems and novel features will become apparent from the description in the present specification and the accompanying drawings.

According to one embodiment, a semiconductor storage device includes multiple memory cells provided in a matrix form and multiple word lines provided to correspond respectively to the rows of the memory cells. The semiconductor storage device further includes a first power supply for the memory cells, which is provided to retain data in the memory cells, a second power supply which is turned on independently of the first power supply and provided for a peripheral circuit which is electrically coupled to the memory cells, and a word line level fixing circuit for fixing the level of the word lines, which operates in accordance with turn-on of the first power supply. Each memory cell includes access transistors which are coupled to the corresponding word lines and serve for executing data reading or writing from/to the memory cells. The word line level fixing circuit includes multiple level fixing transistors which are provided to correspond respectively to the word lines and provided between the corresponding word lines and a fixed potential and a level fixing control circuit which controls the level fixing transistors in accordance with input of a signal responding to turn-on of the second power supply. The level fixing control circuit makes the level fixing transistors conductive in accordance with turn-on of the first power supply, when the second power supply is not yet turned on.

According to one embodiment, it is possible to realize a semiconductor device that creates no trouble, independently of power-on sequence.

BRIEF DESCRIPTION OF THE DRAWINGS

FIG. 3 is a diagram to explain potential levels, when the power supplies are turned on, based on an embodiment.

DETAILED DESCRIPTION

Figure 1:
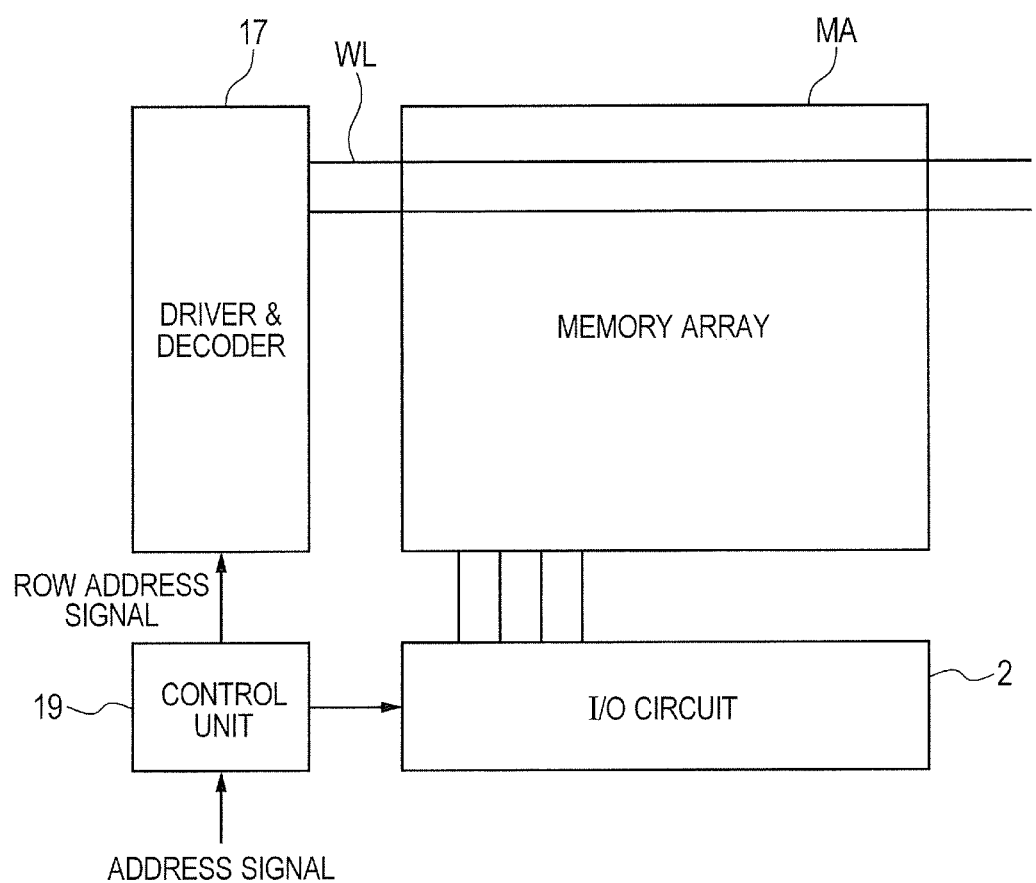
FIG. 1 is an outside structure diagram of a semiconductor storage device based on an embodiment.

Embodiments of the present invention will now be described in detail with reference to the drawings. In the drawings, identical or corresponding components are assigned the same referential numbers or marks and their description is not repeated.

FIG. 1 is an outside structure diagram of a semiconductor storage device based on an embodiment. As depicted in FIG. 1, the semiconductor storage device includes a driver & decoder 17, a memory array MA, a control unit 19, and an I/O circuit 2. A decoder is a simplified term of an address decoder.

The control unit 19 controls all functional blocks of the semiconductor storage device. Particularly, the control unit 19 outputs a row address signal to the driver & decoder 17, based on an address signal which has been input to it. The control unit 19 also outputs various signals to drive the I/O circuit 2.

The memory array MA has multiple memory cells arranged in a matrix form. The memory cells in the memory array MA are provided to be rewritable.

The driver & decoder 17 drives word lines WL provided to correspond respectively to the rows of the memory cells arranged in a matrix form in the memory array MA.

Figure 2:
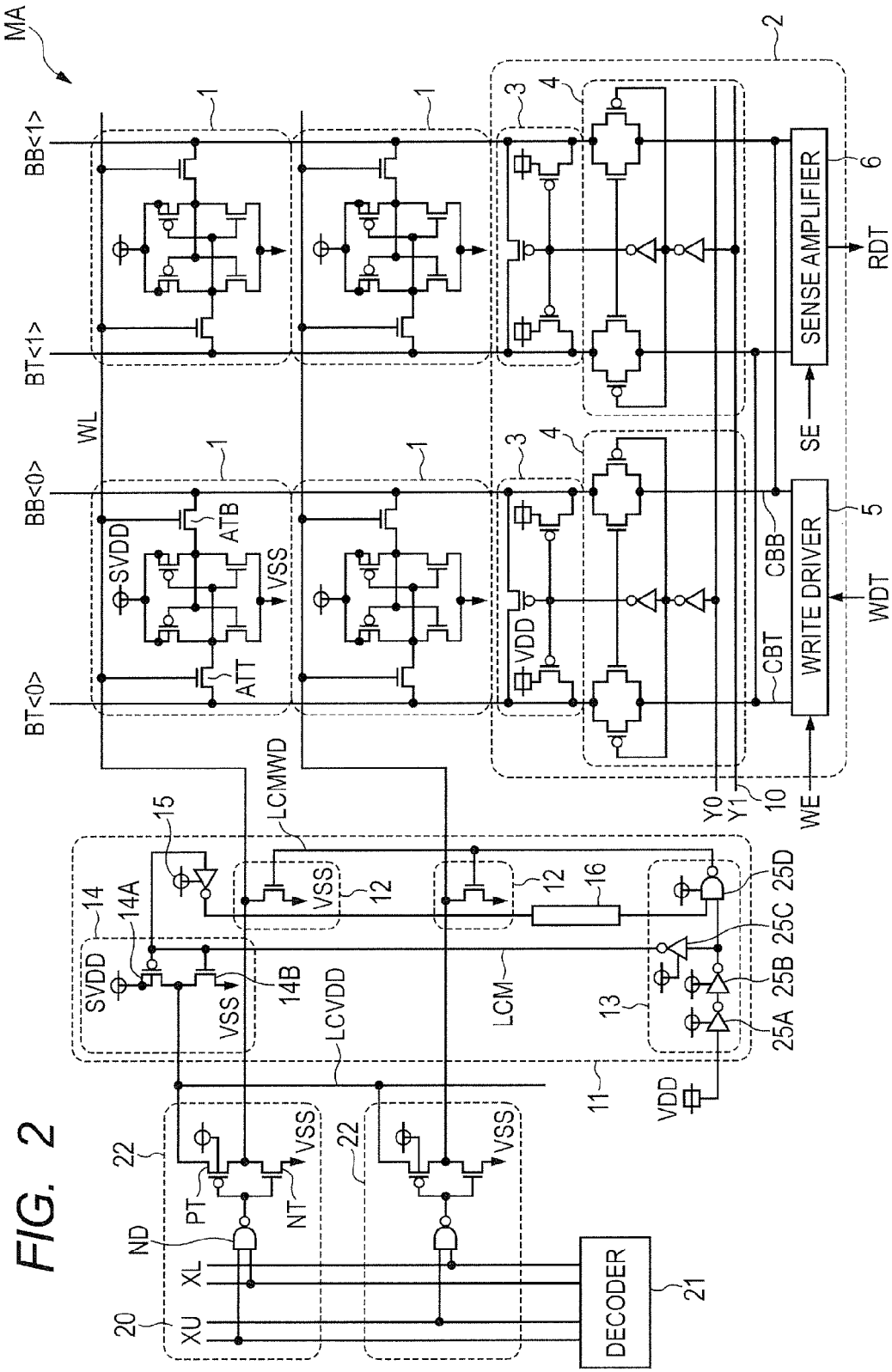
FIG. 2 is a diagram to explain a structure of a memory array MA and a peripheral circuit based on an embodiment.

The I/O circuit 2 is provided as an input/output circuit of the memory array MA. FIG. 2 is a diagram to explain a structure of the memory array MA and a peripheral circuit based on an embodiment.

In the present example, as depicted in FIG. 2, a structure of a dual-rail SRAM is described in which there are separate power supplies: a power supply SVDD for the memory cells in the memory array MA and a power supply VDD for the peripheral circuit.

The memory array MA has multiple memory cells 1 arranged in a matrix form. Each memory cell 1 is an SRAM (Static Random Access Memory) cell provided to be rewritable. In the present example, depicted are the SRAM cells, each having two access transistors ATT and ATB and six transistors. Because details on the SRAM cells are publicly known, their detailed description is omitted. The access transistors ATT and ATB in a memory cell are electrically coupled to a word line WL corresponding to a row in which the memory cell is located. When data is read from or written to the memory cell 1, the access transistors ATT and ATB become conductive upon activation of the word line WL.

The memory cells 1 are electrically coupled to the power supply SVDD for the memory cells and a ground voltage (fixed voltage) VSS. In the present examples, the memory cells arranged in two rows and two columns are depicted.

Multiple word lines WL are provided to correspond respectively to the rows of the memory cells in the memory array MA1.

Multiple bit line pairs are also provided to correspond respectively to the columns of the memory cells in the memory array MA1. In the present example, two columns of memory cells are depicted. Two bit line pairs are provided to correspond to two columns of memory cells. Particularly, bit lines BT<0>, BB<0>, BT<1>, and BB<1> are depicted.

The I/O circuit 2 includes precharging circuits 3 provided for each column of memory cells, selection circuits 4, a write driver 5, and a sense amplifier 6. The power supply VDD for the peripheral circuit is provided in the I/O circuit 2.

When data reading is performed, each of the precharging circuits 3 equalizes a bit line pair linked to it and sets the bit line voltage equal to a voltage of the power supply VDD for the peripheral circuit.

Each of the selection circuits 4 selects a bit line pair, according to decoded signals Y1, Y0. Decoded signals Y1, Y0 are generated by a column decoder, which is not depicted in the present example, based on 1-bit column address data.

Each of the selection circuits 4 couples a bit line pair and a data line pair CBT and CBB, according to decoded signals Y1, Y0. By way of example, if a decoded signal Y0 is "1" ("H" level), a bit line pair BT<0> and BB<0> and the data line pair CBT and CBB are electrically coupled.

On the other hand, if a decoded signal Y1 is "1" ("H" level), a bit line pair BT<1> and BB<1> and the data line pair CBT and CBB are electrically coupled.

If decoded signals Y1, Y0 are "0" ("L" level), the precharging circuits 3 are activated; then, they couple and equalize the bit line pairs BT and BB and electrically couple the bit line pairs to the power supply VDD.

When data writing is performed, the write driver 5 writes data to the memory array MA, according to write data WDT. Particularly, the write driver 5 is activated according to an activation signal WE and drives the data line pair CBT and CBB, based on write data WDT. By way of example, if write data WDT is "1", the write driver 5 sets the data line pair CBT and CBB to "1" and "0". Thereby, a bit line pair coupled to the data line pair CBT and CBT via a selection circuit 4 is driven. And data is written to a memory cell 1 corresponding to a selected word line WL.

The sense amplifier 6 is activated according to an activation signal SE and outputs a read data RDT from the memory array MA1, when data reading is performed. Particularly, when data reading is performed, the sense amplifier 6 is activated by the activation signal SE and it amplifies a potential difference transferred to a bit line pair coupled to the data line pair CBT and CBB in accordance with data retained by a memory cell 1 and outputs read data RDT. A bit line pair is coupled to the data line pair CBT and CBB via a selection circuit 4, according to a decoded signal Y.

The driver & decoder 17 includes a predecoder 21 which predecodes a row address signal from the control unit 19 and multiple driver units 22 provided to correspond to the multiple word lines WL provided to correspond respectively to the rows of memory cells.

The predecoder 21 outputs a predecoded signal XU which is a result of predecoding upper bits of a row address signal. It also outputs a predecoded signal XL which is a result of predecoding lower bits of a row address signal.

Each of the driver units 22 includes a NAND circuit ND which outputs a selection signal based on a predecoded signal XU and a predecoded signal XL, and a P-channel MOS transistor PT and an N-channel MOS transistor NT which drive a word line WL, based on a selection signal from the NAND circuit ND.

The P-channel MOS transistor PT and the N-channel MOS transistor NT are coupled between a word power supply line LCVDD and a ground voltage VSS, and a node at which these transistors are coupled is electrically coupled to a word line WL.

If a selection signal from the NAND circuit ND is "0" ("L" level), the P-channel MOS transistor PT becomes conductive and the word power supply line LCVDD and the word line WL are electrically coupled.

If a selection signal from the NAND circuit ND is "1" ("H" level), the N-channel MOS transistor NT becomes conductive and the ground voltage VSS and the word line WL are electrically coupled.

Normally, the same potential as supplied to the memory cells 1 is supplied to the word lines WL in the light of operation stability of the memory cells 1. Therefore, the power supply SVDD for the memory cells is coupled to the source and back gate of the P-channel MOS transistor in each driver unit 22.

Then, a description is provided about a word line level fixing circuit 11. The word line level fixing circuit 11 is driven with the power supply SVDD for the memory cells.

The word line level fixing circuit 11 includes multiple level fixing transistors 12 which are provided to correspond respectively to the multiple word lines WL, a control circuit 13 which generates a word line level fixing signal LCMWD, a power supply line driving circuit 14 which drives the word power supply line LCVDD, a delay element 16, and an inverter 15.

The delay element 16 delays a signal for a given period, using a resistor or inverter and the like. It may be feasible to form the delay element based on wiring resistance without forming a physical circuit.

The control circuit 13 includes inverters 25A to 25C and a NAND circuit 25D. Inverters 25A and 25B are coupled in series and receive, as input, a signal responding to turn-on of the power supply VDD for the peripheral circuit.

An inverter 25C outputs a control signal LCM which is an inversion of a signal output by the inverter 25B.

The power supply line driving circuit 14 is driven by the control signal LCM. The power supply line driving circuit 14 includes a P-channel MOS transistor 14A and an N-channel MOS transistor 14B provided between the power supply SVDD and the ground voltage VSS.

A node at which the P-channel MOS transistor 14A and the N-channel MOS transistor 14B are coupled is coupled to the word power supply line LCVDD. The gates of the P-channel MOS transistor 14A and the N-channel MOS transistor 14B receive, as input, the control signal LCM.

If the control signal LCM is "0" ("L" level), the P-channel MOS transistor 14A becomes conductive and the word power supply line LCVDD and the power supply SVDD are electrically coupled.

If the control signal LCM is "1" ("H" level), the N-channel MOS transistor 14B becomes conductive and the word power supply line LCVDD and the ground voltage VSS are electrically coupled.

The control signal LCM is input to one input node of the NAND circuit 25D via the inverter 15 and the delay element 16.

The other input node of the NAND circuit 25D receives, as input, an output signal of the inverter 25B.

The NAND circuit 25D outputs a result of a NAND logic operation on the output signal of the inverter 25B and the signal received via, inter alia, the delay element 16, as a word line level fixing signal LCMWD.

FIG. 3 is a diagram to explain potential levels, when the power supplies are turned on, based on an embodiment. A description is provided about operation in a case where the power supply SVDD for the memory cells is turned on first, as is represented in FIG. 3.

First, a description is provided about a state when both the power supply VDD for the peripheral circuit and the power supply SVDD for the memory cells are not yet turned on (both being at "L" level).

Because no voltage is applied to the N-Wells of the transistors, any signal is not transferred and the control signal LCM, word line level fixing signal LCMWD, word power supply line LCVDD, word lines WL, and predecoded signals XU, XL are all in an unfixed state.

Then, the power supply SVDD for the memory cells is turned on at time T1 and has changed to "H" level, as is represented in the diagram.

Thereby, voltage is applied to the N-Wells of the transistors coupled with the power supply SVDD for the memory cells and signals are transmitted through the circuits coupled with the power supply SVDD for the memory cells.

In the case of the present example, the power supply VDD for the peripheral circuit remains at "L" level. Therefore, the control circuit 13 sets the control signal LCM at "H" level according to the input of a signal ("L" level) responding to the potential of the power supply VDD. Thereby, in the power supply line driving circuit 14, the N-channel MOS transistor 14B becomes conductive and electrically couples the word power supply line LCVDD to the ground voltage VSS.

Also, in the NAND circuit 25D in the control circuit 13 according to the input of a signal ("L" level) responding to the potential of the power supply VDD, the word line level fixing signal LCMWD is set at "H" level.

According to the word line level fixing signal LCMWD ("H" level), the level fixing transistors 12 become conductive and electrically couple the word lines WL to the ground voltage VSS. The word lines WL are set at "L" level.

Thereby, at power on, even in a case where the power supply SVDD for the memory cells has been turned on before turning on the power supply VDD for the peripheral circuit, the word lines WL are set at "L" level and thus the access transistors ATT and ATB in each memory cell 1 are put in a non-conductive state.

Therefore, the potential of the word lines WL never becomes unfixed. What is happening if the potential of the word lines WL becomes unfixed is now described below. When the power supply SVDD for the memory cells is turned on, the voltage of the power supply SVDD for the memory cells is applied to either of internal nodes in a memory cell 1 by inverter cross-coupling action.

On the other hand, the power supply VDD for the peripheral circuit is set at "L" level. Here, if the potential of the word lines WL becomes unfixed, there is a possibility of through-current flowing between the power supply SVDD for the memory cells applied to an internal node in a memory cell 1 and the back gate of a P-channel MOS transistor in a precharging circuit 3 or the back gate of a P-channel MOS transistor in a selection circuit 4, in which these transistors are coupled with the power supply VDD for the peripheral circuit ("L" level) and electrically coupled to the power supply SVDD, via the access transistors ATT and ATB.

Therefore, as in the structure based on an embodiment, by fixing the word lines WL at "L" level, it is possible to prevent through-current from flowing between the power supply SVDD for the memory cells and the power supply VDD for the peripheral circuit and avoid trouble such as malfunction and failure.

Then, a description is provided about a state when the power supply VDD for the peripheral circuit has been turned on. The power supply VDD for the peripheral circuit is turned on at time T2 and has turned to "H" level, as is represented in the diagram.

Thereby, the control circuit 13 sets the control signal LCM at "L" level according to the input of a signal ("H" level) responding to the potential of the power supply VDD. Thereby, in the power supply line driving circuit 14, the P-channel MOS transistor 14A becomes conductive and electrically couples the word power supply line LCVDD to the power supply SVDD for the memory cells. The power supply SVDD is supplied to the word power supply line LCVDD.

Also, the signal ("H" level) responding to the potential of the power supply VDD is input to one input node of the NAND circuit 25D in the control circuit 13. To the other input node, the signal ("H" level) responding to the potential of the power supply VDD is delayed and input via the inverter 25C, inverter 15, and delay element 16. A signal path through the inverter 25C, inverter 15, and delay element 16 is also referred to as a delay path.

And, the NAND circuit ND25D sets the word line level fixing signal LCMWD at "L" level, based on a result of delaying the signal ("H" level) responding to the potential of the power supply VDD through the delay path. This is because a certain period of time is taken after the power supply VDD for the peripheral circuit is turned on until the control unit 19 is stabilized and the predecoded signals XU, XL are set at "L" level.

During that period, the word line level fixing signal LCMWD is maintained at "H" level and the word lines WL is maintained to remain at "L" level. It is thus possible to prevent the word lines WL from becoming unfixed and turning to "H" level. Thereby, it is possible to prevent through-current from flowing between the power supply SVDD for the memory cells and the power supply VDD for the peripheral circuit.

After the elapse of the certain period, according to the word line level fixing signal LCMWD ("L" level), the level fixing transistors 12 become non-conductive and decouples the word lines WL from the ground voltage VSS. Then, the word lines WL are driven by the driver units 22. That is, transition to a normal operation mode occurs and the word lines WL are activated according to the predecoded signals XU, XL.

Thereby, at power on, even in a case where the power supply SVDD for the memory cells has been turned on before turning on the power supply VDD for the peripheral circuit, it is possible to make the storage device operate normally, independently of power-on sequence.

In a case where the power supply VDD for the peripheral circuit has been turned on before turning on the power supply SVDD for the memory cells, the control unit 19 is initialized and the predecoded signals XU, XL are set at "L" level.

Thereby, the N-channel MOS transistor NT in each of the driver units 22 becomes conductive and the word lines WL are electrically coupled to the ground voltage VSS. Therefore, the word lines WL are set at "L" level. So, the word lines WL never become unfixed and there is no possibility of through-current flowing between the power supply VDD for the peripheral circuit and the power supply SVDD for the memory cells.

By configuring the dual-rail SRAM in this way, it would become possible to drive the circuits without creating trouble, independently of power-on sequence when turning on the power supply VDD for the peripheral circuit and the power supply SVDD for the memory cells, and it would become possible to realize an architecture of circuits that are easy to design for circuit designers.

While the invention disclosed herein has been described specifically based on its embodiments hereinbefore, it goes without saying that the present invention is not limited to the embodiments and various modifications may be made thereto without departing from the scope of the invention.

What is claimed is:

1. A semiconductor storage device comprising:
a plurality of memory cells provided in a matrix form;
a plurality of word lines provided to correspond respectively to the rows of the memory cells;
a first power supply for the memory cells, which is provided to retain data in the memory cells;
a second power supply which is turned on independently of the first power supply and provided for a peripheral circuit which is electrically coupled to the memory cells; and
a word line level fixing circuit for fixing the level of the word lines, which operates in accordance with turn-on of the first power supply,
wherein each of the memory cells comprises access transistors which are coupled to one of the word lines and serve for executing data reading or writing from/to the memory cells,
wherein the word line level fixing circuit comprises: a plurality of level fixing transistors which are provided to correspond respectively to the word lines and provided between one of the word lines and a fixed potential; and a level fixing control circuit which controls the level fixing transistors in accordance with input of a signal responding to turn-on of the second power supply, and
wherein the level fixing control circuit makes the level fixing transistors conductive in accordance with turn-on of the first power supply, when the second power supply is not yet turned on.

2. The semiconductor storage device according to claim 1, further comprising:
a decoder which selects a word line in accordance with an address signal; and
a plurality of word line drivers which are provided respectively to correspond to the word lines and drive the corresponding word lines,
wherein the decoder outputs a "deselect" signal to the word line drivers respectively when the second power supply has been turned on, and
wherein each of the word line drivers sets the corresponding word lines at the fixed potential according to the "deselect" signal when the second power supply has been turned on.

3. The semiconductor storage device according to claim 2, further comprising:
a power supply line for drivers which is coupled to the word line drivers and supplies a voltage for driving the word lines,
wherein the word line level fixing circuit further comprises a power supply line driving circuit which drives the power supply line for drivers in accordance with input of a signal responding to turn-on of the second power supply.

4. The semiconductor storage device according to claim 3, wherein the power supply line driving circuit supplies the first power supply to the power supply line for drivers when the second power supply has been turned on.

5. The semiconductor storage device according to claim 3 or 4, wherein the power supply line driving circuit sets the power supply line for drivers at the fixed potential until the second power supply is turned on.

6. The semiconductor storage device according to claim 1, wherein the level fixing control circuit sets the level fixing transistors non-conductive when the second power supply has been turned on.

7. The semiconductor storage device according to claim 6, wherein the level fixing control circuit has a plurality of input nodes, of which one input node receives a signal responding to turn-on of the second power supply and the other input node is coupled to a delay path to delay a signal responding to turn-on of the second power supply, and sets the level fixing transistors non-conductive, based on a signal delayed through the delay path, when the second power supply has been turned on.

8. A semiconductor storage device comprising:
a plurality of memory cells provided in a matrix form;
a plurality of word lines provided to correspond respectively to the rows of the memory cells;
a first power supply for the memory cells, which is provided to retain data in the memory cells;
a second power supply which is turned on independently of the first power supply and provided for a peripheral circuit which is electrically coupled to the memory cells; and
a word line level fixing circuit for fixing the level of the word lines, which operates in accordance with turn-on of the first power supply,
wherein a potential difference is produced between the memory cells and the peripheral circuit upon turn-on of the first power supply, when the second power supply is not yet turned on,
wherein each of the memory cells comprises access transistors which are coupled to one of the word lines and serve for executing data reading or writing from/to the memory cells,
wherein the word line level fixing circuit comprises: a plurality of level fixing transistors which are provided to correspond respectively to the word lines and provided between one of the word lines and a fixed potential; and a level fixing control circuit which controls the level fixing transistors in accordance with input of a signal responding to turn-on of the second power supply, and wherein the level fixing control circuit makes the level fixing transistors conductive in accordance with turn-on of the first power supply, when the second power supply is not yet turned on.

* * * * *